United States Patent
Ueda et al.

(10) Patent No.: US 10,643,683 B2
(45) Date of Patent: May 5, 2020

(54) MAGNETIC MEMORY

(71) Applicant: TOSHIBA MEMORY CORPORATION, Minato-ku (JP)

(72) Inventors: Yoshihiro Ueda, Yokohama (JP); Shinji Miyano, Yokohama (JP); Michael Arnaud Quinsat, Yokohama (JP); Tsuyoshi Kondo, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/285,823

(22) Filed: Feb. 26, 2019

(65) Prior Publication Data

US 2020/0082863 A1  Mar. 12, 2020

(30) Foreign Application Priority Data

Sep. 12, 2018 (JP) .................. 2018-170922

(51) Int. Cl.
| | | |
|---|---|---|
| G11C 11/00 | (2006.01) | |
| G11C 11/16 | (2006.01) | |
| H01L 27/22 | (2006.01) | |
| H01L 43/08 | (2006.01) | |

(52) U.S. Cl.
CPC ...... *G11C 11/1675* (2013.01); *G11C 11/1655* (2013.01); *G11C 11/1659* (2013.01); *G11C 11/1673* (2013.01); *H01L 27/228* (2013.01); *H01L 43/08* (2013.01)

(58) Field of Classification Search
CPC ................................ G11C 11/161; G11C 11/1673; G11C 11/1675
See application file for complete search history.

(56) References Cited

U.S. PATENT DOCUMENTS

| | | | |
|---|---|---|---|
| 7,338,776 B2 | 6/2008 | Fontana, Jr. | |
| 7,606,065 B2 | 10/2009 | Fontana, Jr. | |
| 8,018,765 B2 | 9/2011 | Fontana, Jr. | |
| 9,236,106 B2 | 1/2016 | Nakamura | |
| 9,293,696 B2 | 3/2016 | Ootera et al. | |
| 2003/0058684 A1* | 3/2003 | Tran ...................... | G11C 11/161 365/158 |
| 2003/0117869 A1* | 6/2003 | Hidaka ............... | G11C 11/1659 365/200 |
| 2003/0169620 A1* | 9/2003 | Sharma ............... | G11C 11/1673 365/173 |

(Continued)

FOREIGN PATENT DOCUMENTS

| | | |
|---|---|---|
| JP | 2008-192711 | 8/2008 |
| JP | 2011-119537 | 6/2011 |

(Continued)

*Primary Examiner* — Tuan T Nguyen
(74) *Attorney, Agent, or Firm* — Oblon, McClelland, Maier & Neustadt, L.L.P.

(57) ABSTRACT

According to one embodiment, there is provided a magnetic memory including a magnetic material column, a shift control circuit, and a write control circuit. The shift control circuit is connected to the magnetic material column. The write control circuit is configured to cause a current to flow through a write line passing near one end of the magnetic material column if writing data having a first value into the magnetic material column, and cause no current to flow through the write line if writing data having a second value into the magnetic material column.

20 Claims, 13 Drawing Sheets

(56) References Cited

U.S. PATENT DOCUMENTS

| | | | |
|---|---|---|---|
| 2003/0202375 A1* | 10/2003 | Sharma | G11C 11/16 365/158 |
| 2015/0380638 A1* | 12/2015 | Ootera | G11C 11/161 257/421 |
| 2016/0042781 A1* | 2/2016 | Alam | G11C 11/165 365/66 |
| 2019/0287593 A1 | 9/2019 | Ueda | |

FOREIGN PATENT DOCUMENTS

| | | |
|---|---|---|
| JP | 5094364 | 12/2012 |
| JP | 6104774 | 3/2017 |
| JP | 6271350 | 1/2018 |

* cited by examiner

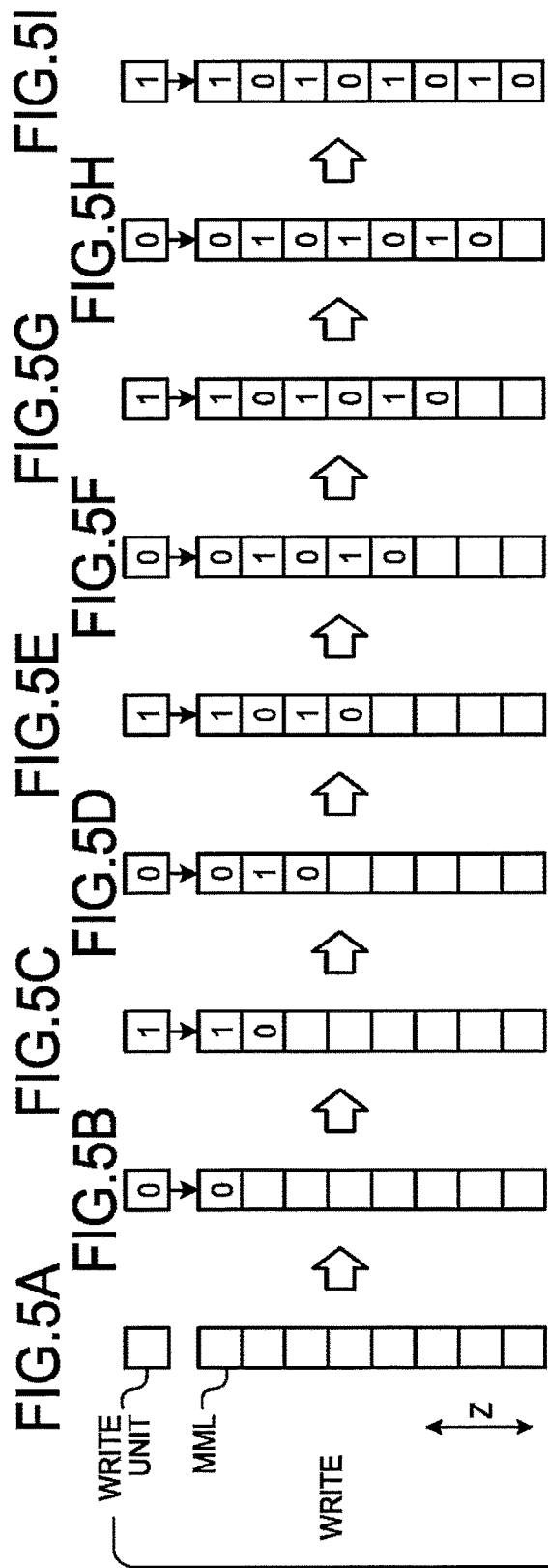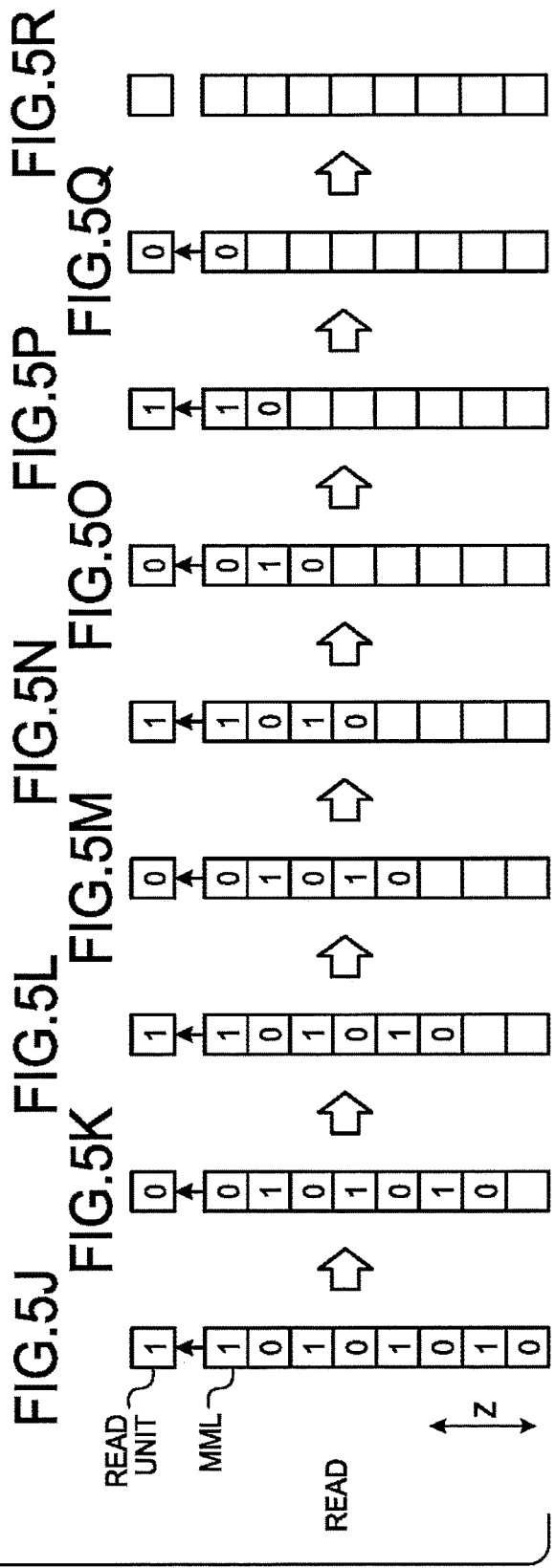

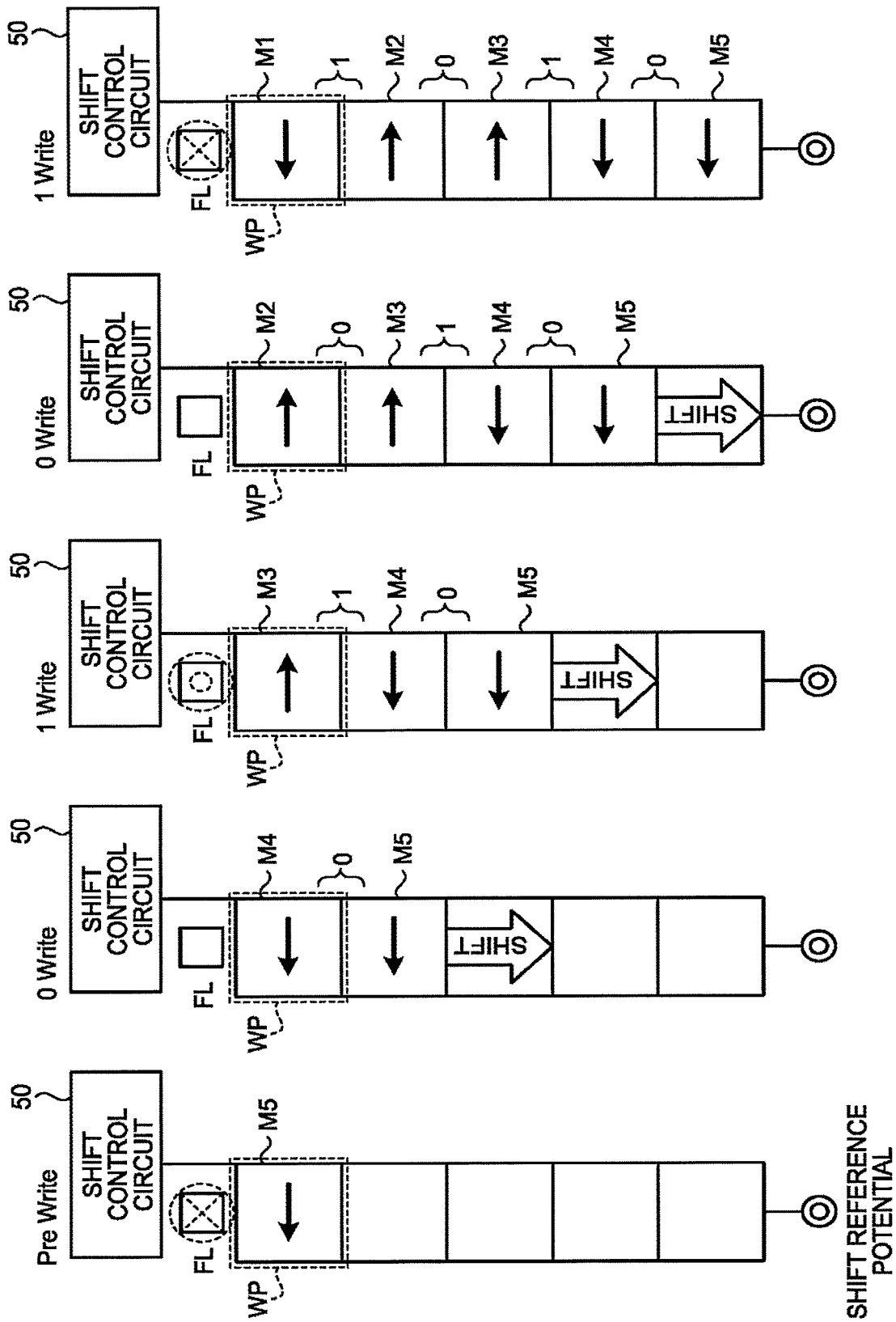

MAGNETIC MEMORY

CROSS-REFERENCE TO RELATED APPLICATIONS

This application is based upon and claims the benefit of priority from Japanese Patent Application No. 2018-170922, filed on Sep. 12, 2018; the entire contents of which are incorporated herein by reference.

FIELD

Embodiments described herein relate generally to a magnetic memory.

BACKGROUND

In a magnetic memory having magnetic material columns, magnetic domains are formed in each magnetic material column and information is written. At this time, the magnetic memory is desired to be operated with low power consumption.

BRIEF DESCRIPTION OF THE DRAWINGS

FIGS. 5A to 5R are diagrams illustrating a write operation and a read operation in the embodiment;

FIGS. 6A to 6E are diagrams illustrating a write operation in the embodiment;

DETAILED DESCRIPTION

Figure 1:
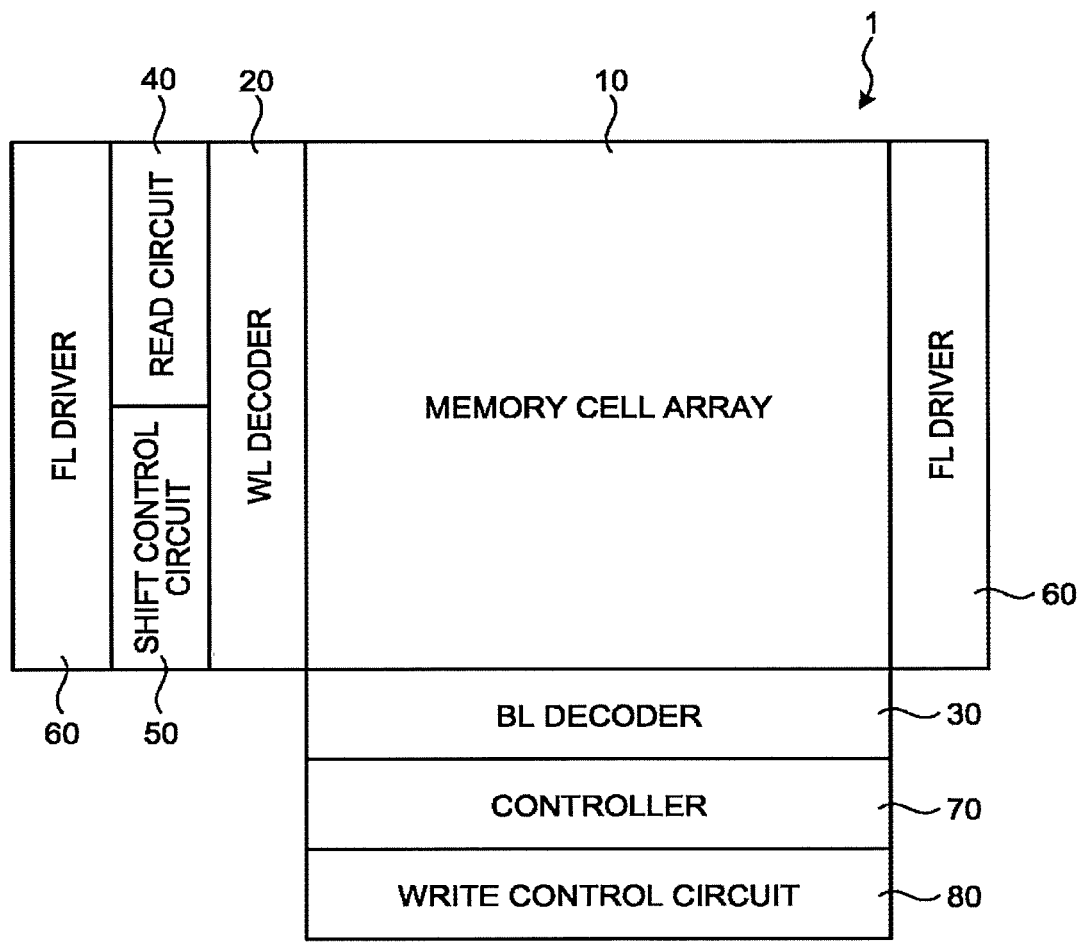
FIG. 1 is a block diagram illustrating a configuration of a magnetic memory according to an embodiment.

In general, according to one embodiment, there is provided a magnetic memory including a magnetic material column, a shift control circuit, and a write control circuit. The shift control circuit is connected to the magnetic material column. The write control circuit is configured to cause a current to flow through a write line passing near one end of the magnetic material column if writing data having a first value into the magnetic material column, and cause no current to flow through the write line if writing data having a second value into the magnetic material column.

Exemplary embodiments of a magnetic memory will be explained below in detail with reference to the accompanying drawings. The present invention is not limited to the following embodiments.

Embodiment

The magnetic memory according to the embodiment will be described. The magnetic memory has magnetic material columns and writes information by forming magnetic domains in each magnetic material column. For example, a first write method is considered which writes a binary value by using a magnetization direction for each magnetic domain in the magnetic material column. In the first write method, every time a shift current is flown through the magnetic material column and a magnetic wall in the magnetic material column is shifted, a current in a direction according to data to be written is flown through a write line passing near one end of the magnetic material column. In the first write method, when writing the data of the first value, a current in a first direction is flown through the write line, and when writing the data of the second value, a current in a second direction opposite to the first direction is flown through the write line. Thereby, an induction magnetic field in a direction according to data to be written is generated in an area near one end of the magnetic material column, and writing is performed. In the first write method, every time the writing is performed, a relatively large current to generate the induction magnetic field is flown through the write line, so that power consumption easily increases.

Therefore, in the present embodiment, in the magnetic memory, when writing the data of the first value, a current is flown through the write line so as to form a magnetic wall, and when writing the data of the second value, no current is flown through the write line so as not to form a magnetic wall, so that the power consumption of the magnetic memory is reduced.

Specifically, in the magnetic memory, the second write method different from the first write method is adopted. The magnetic memory writes data to the magnetic material column according to the second write method. In the second write method, a binary value (the first value or the second value) is written by presence or absence of magnetic wall in the magnetic material column. Regarding each magnetic domain which is shifted by the shift current, a state, where the magnetization direction of a magnetic domain and the magnetization direction of its adjacent magnetic domain are different from each other and there is a magnetic wall between the magnetic domain and its adjacent magnetic domain, can be defined as a state where the first value is written. The first value may be, for example, "1". A state, where the magnetization direction of a magnetic domain and the magnetization direction of its adjacent magnetic domain are the same and there is no magnetic wall between the magnetic domain and its adjacent magnetic domain, can be defined as a state where the second value is written. The second value may be, for example, "0".

In the second write method, the magnetic memory causes a current to flow in the write line in a direction in which a magnetic domain whose magnetization direction is opposite to that of a magnetic domain near one end of the magnetic material column is formed according to the first data. Thereby, an induction magnetic field is generated around the write line, a magnetization direction of the uppermost magnetic domain near one end of the magnetic material column is reversed with respect to the magnetization direction of the magnetic domain below the uppermost magnetic domain, a magnetic wall is formed between the uppermost magnetic domain and the magnetic domain below the uppermost magnetic domain, and the first value is written.

The magnetic memory does not flow a current in the write line according to the data of the second value. Thereby, no induction magnetic field is generated around the write line, the magnetization direction of the uppermost magnetic domain near one end of the magnetic material column is maintained equal to the magnetization direction of the magnetic domain below the uppermost magnetic domain, and no magnetic wall is formed between the uppermost magnetic domain and the magnetic domain below the uppermost magnetic domain. As a result, it is assumed that the second value is written.

More specifically, a magnetic memory 1 can be configured as illustrated in FIG. 1. FIG. 1 is a block diagram illustrating a configuration of the magnetic memory 1.

The magnetic memory 1 illustrated in FIG. 1 has a memory cell array 10, a word line (WL) decoder 20, a bit line (BL) decoder 30, a read circuit 40, a shift control circuit 50, a field line (FL) driver 60, a write control circuit 80, and a controller 70.

The memory cell array 10 has a plurality of magnetic material columns. Each magnetic material column includes a plurality of magnetic domains (or magnetic walls) for storing data. In the memory cell array 10, the magnetic material columns are arranged in a matrix form. The magnetic material column is electrically connected between the word line WL and the bit line BL. The magnetic material column is also called a magnetic thin line or a magnetic storage thin line. Details of the magnetic material column will be described later.

The word line decoder (WL decoder) 20 selects one word line from a plurality of word lines WL based on a row address. The bit line decoder (BL decoder) 30 selects one bit line from a plurality of bit lines BL based on a column address. The read circuit 40 has a sense amplifier and reads data from a magnetic material column in the memory cell array 10. In a read operation, the shift control circuit 50 applies a voltage to move magnetic domains (or magnetic walls) in the magnetic material column. Specifically, the shift control circuit 50 outputs a shift current to shift each magnetic domain arranged in the magnetic material columns. The write control circuit 80 writes data to a magnetic material column in the memory cell array 10. When write is performed, the field line driver (FL driver) 60 causes a current to flow through a field line according to control from the write control circuit 80 and causes the field line to generate an induction magnetic field according to data to be written.

Figure 2:
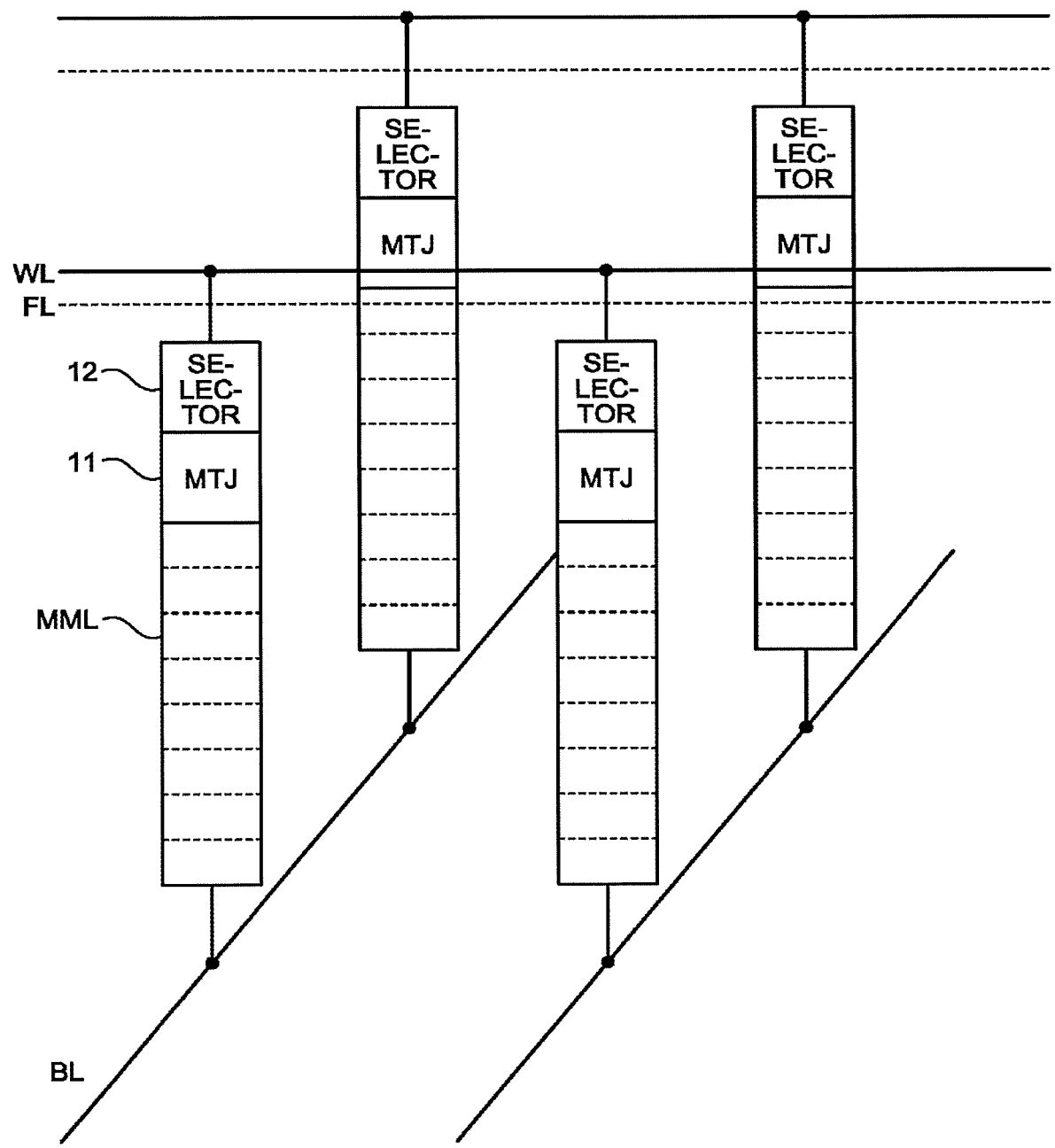
FIG. 2 is a circuit diagram illustrating a configuration of a memory cell array in the embodiment.

Next, a circuit configuration of the memory cell array 10 will be described with reference to FIG. 2. FIG. 2 is a diagram illustrating a circuit configuration of the memory cell array 10.

A magnetic material column MML is connected between the word line WL and the bit line BL. One end of the magnetic material column MML is connected to the word line WL through a magnetoresistive effect element (or a resistance change element or a variable resistive element) 11 and a selective element (selector) 12 in order. In other words, one end of the magnetic material column MML is connected to one end of the magnetoresistive effect element 11, and the other end of the magnetoresistive effect element 11 is connected to one end of the selective element 12. The other end of the selective element 12 is connected to the word line WL. Further, the other end of the magnetic material column MML is connected to the bit line BL.

The magnetoresistive effect element 11 includes, for example, a Magnetic Tunnel Junction (MTJ) element whose resistance varies according to a magnetization state. For example, the selective element 12 includes an element which becomes a low resistance state when a voltage higher than or equal to a threshold voltage is applied and becomes a high resistance state when a voltage lower than the threshold voltage is applied. The selective element 12 may be, for example, an inter-terminal switch element. When a voltage applied between the two terminals is lower than or equal to a threshold value, the switch element is in a high resistance state, for example, in an electrically non-conductive state. When the voltage applied between the two terminals is higher than or equal to the threshold value, the switch element is changed into a low resistance state, for example, into an electrically conductive state. Even when the voltage is negative or positive, the switch element may have the above function. The switch element includes at least one kind of chalcogen element selected from a group consisting of Te, Se, and S. Alternatively, the switch element may include chalcogenide that is a compound containing the chalcogen element. Further, the switch element may include at least one kind of element selected from a group consisting of B, Al, Ga, In, C, Si, Ge, Sn, As, P, and Sb.

For example, pluralities of the magnetic material columns MML, the magnetoresistive effect elements 11, and the selective elements 12, which are arranged in a first direction, are connected to the same word line WL at the other ends of the selective elements 12. On the other hand, pluralities of the magnetic material columns MML, the magnetoresistive effect elements 11, and the selective elements 12, which are arranged in a second direction crossing the first direction, are connected to the same bit line BL at the other ends of the magnetic material columns MML.

Figure 3:
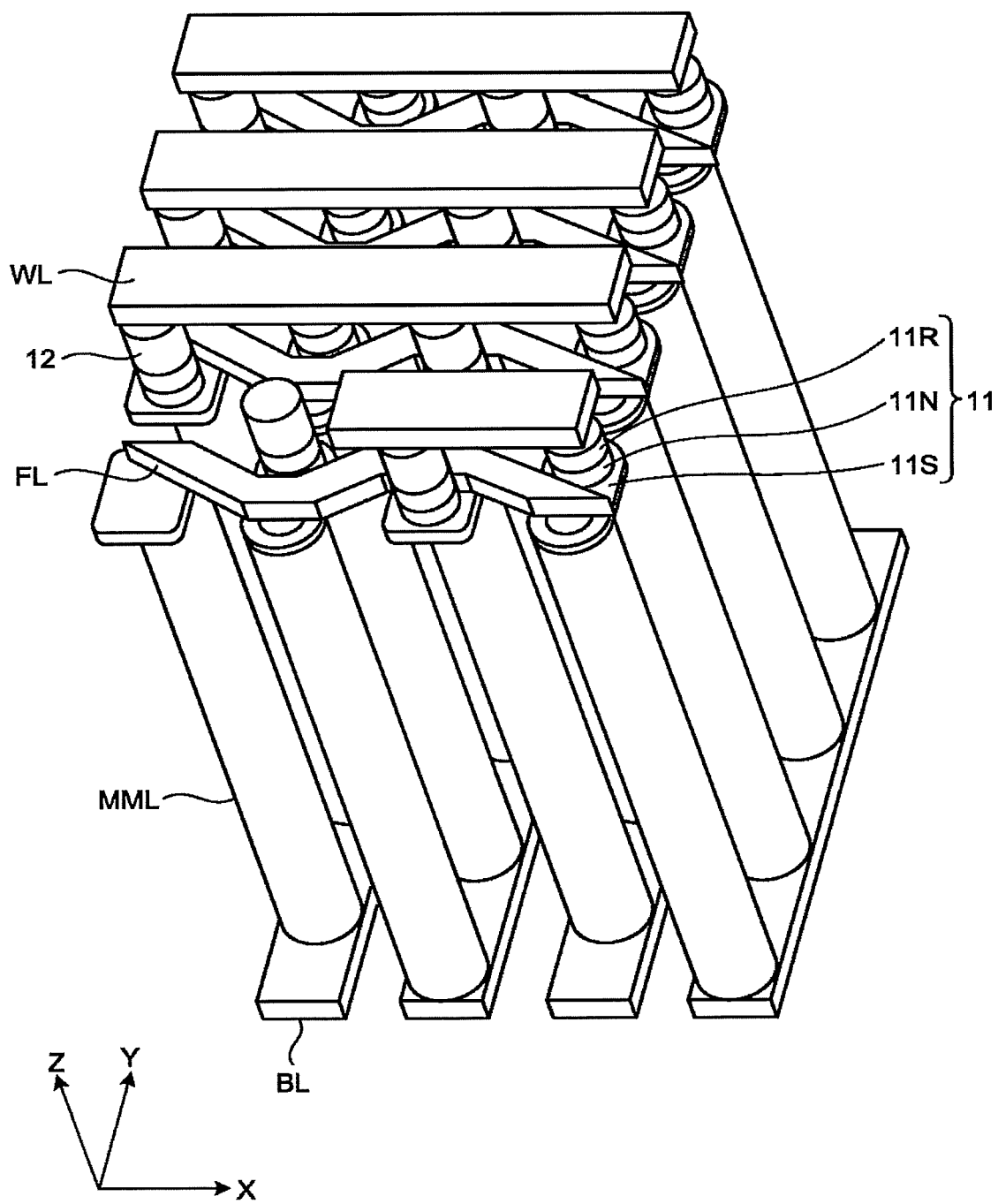
FIG. 3 is a diagrammatic perspective view illustrating a configuration of the memory cell array in the embodiment.

FIG. 3 is a diagrammatic perspective view illustrating an example of a configuration of the memory cell array 10. In FIG. 3, the two directions crossing each other are defined as an X direction and a Y direction, and a direction which is perpendicular to the X direction and the Y direction (XY plane) and in which the magnetic material columns MML extend is defined as a Z direction.

A plurality of the bit lines BL extending in the Y direction are arranged in the X direction. On the bit line BL, the magnetic material column MML, the magnetoresistive effect element 11, and the selective element 12 are arranged in the Z direction. The magnetoresistive effect element 11 is composed of, for example, the MTJ element. The MTJ element includes a magnetic layer 11R, a non-magnetic layer 11N, and a magnetic layer 11S. Details of the MTJ element will be described later.

Details of the configuration of the memory cell array 10 will be described. On the bit line BL, the magnetic material column MML is provided. On the magnetic material column MML, the magnetic layer 11S is provided. The magnetic layer 11S extends in the Y direction by a certain distance. On the extending magnetic layer 11S, the non-magnetic layer 11N and the magnetic layer 11R are provided in order. On the magnetic layer 11R, the word line WL is provided through the selective element 12.

The magnetic material columns MML, the magnetoresistive effect elements 11, and the selective elements 12, which are provided in the Z direction, are arranged in a matrix from in the X direction and the Y direction. The word line WL is provided on the selective elements 12 arranged in the X direction. Further, on the magnetic layer 11S, a field line (write line) FL is provided. The field line FL is arranged in a zig-zag shape in the X direction so as to meander between the magnetoresistive effect elements 11 adjacent to each other in the X direction and the Y direction.

Hereinafter, the magnetoresistive effect element (MTJ element) 11 will be described in detail. The magnetoresistive effect element 11 includes the magnetic layer 11R, the non-magnetic layer 11N, and the magnetic layer 11S. The non-magnetic layer 11N is arranged between the magnetic layer 11R and the magnetic layer 11S. The magnetic layer 11R functions as a reference layer. The magnetic layer 11S functions as a storage layer. The non-magnetic layer 11N functions as a tunnel barrier. The MTJ element may include an additional layer.

The magnetic layer (storage layer) 11S is magnetized in a direction along a certain axis. For example, the magnetization of the magnetic layer 11S is stable along a direction perpendicular to boundary surfaces between the layers 11S, 11R, and 11N. The magnetization direction of the magnetic layer 11S can be reversed by a magnetization direction of a magnetic domain included in the magnetic material column MML.

The magnetic layer (reference layer) 11R has magnetization whose direction is fixed or invariable. For example, the magnetic layer 11R has a coercive force higher than that of the magnetic layer (storage layer) 11S. The fact that the magnetization direction of the magnetic layer 11R is "fixed" or "invariable" means that the magnetization direction of the magnetic layer 11R is not reversed by the magnetization direction of the magnetic domain of the magnetic material column MML, which reverses the magnetization of the magnetic layer (storage layer) 11S.

A set of the magnetic layer 11R, the non-magnetic layer 11N, and the magnetic layer 11S exhibits a magnetoresistive effect. Specifically, when the magnetization direction of the magnetic layer 11S and the magnetization direction of the magnetic layer 11R are parallel or anti-parallel with each other, the MTJ element exhibits a minimum or a maximum resistance value, respectively. The magnetoresistive effect element (MTJ element) 11 can have a low resistance state when a relative relationship of the magnetization direction between the magnetic layer (storage layer) 11S and the magnetic layer (reference layer) 11R is parallel, and can have a high resistance state when the relative relationship is anti-parallel.

Figure 4:
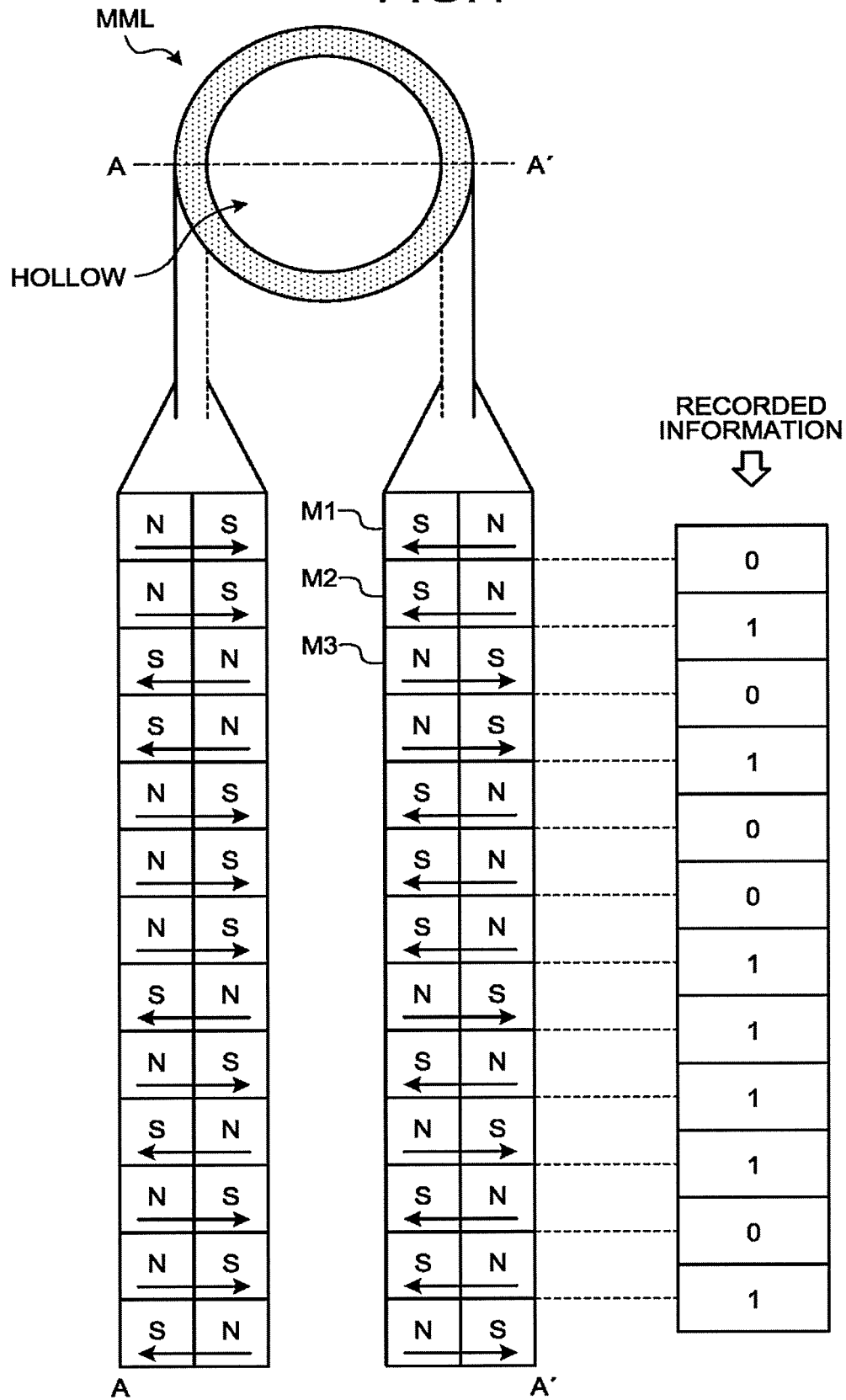
FIG. 4 is a diagram illustrating a method of writing information into a magnetic material column in the embodiment.

Next, a configuration and an information storage method of the magnetic material column MML will be described with reference to FIG. 4. FIG. 4 is a diagram illustrating a cross-sectional structure taken along line A-A' of one magnetic material column MML illustrated in FIG. 3, an example of magnetic domains (or magnetization states) included in the magnetic material column MML, and an information storage method using the magnetic domains.

The magnetic material column MML included in the magnetic memory is composed of, for example, a linear ferromagnetic body extending in the Z direction as illustrated in FIG. 3. The linear ferromagnetic body may have a hollow tubular shape (for example, a cylindrical shape) as illustrated in FIG. 4 or may have a solid tubular shape. The ferromagnetic body has a plurality of magnetic domains along the Z direction. For example, the magnetic material column MML has magnetic domains M1, M2, M3, and so on along the Z direction on a cross-section of a cylindrical magnetic thin film.

Each magnetic domain can hold magnetization (or a magnetization state) in one direction or in a direction opposite to the one direction. As illustrated in FIG. 4, each magnetic domain has a magnetization direction in which N-pole and S-pole are formed in this order from the outside of the cylinder, and conversely, a magnetization direction in which S-pole and N-pole are formed in this order from the outside of the cylinder. A boundary between magnetic domains when the magnetic domains have different magnetization directions is called a magnetic wall. The magnetization direction of each magnetic domain may be a direction perpendicular to the Z direction in which the magnetic material column MML extends (a perpendicular magnetization film) or may be the Z direction in which the magnetic material column MML extends (an in-plane magnetization film).

When the magnetization directions of two magnetic domains adjacent to each other in the Z direction are the same, second data is stored. On the other hand, when the magnetization directions of two magnetic domains adjacent to each other are different from each other, first data different from the second data is stored. For example, the magnetization directions of the magnetic domain M1 and the magnetic domain M2 are the same, so that "0" is stored. On the other hand, the magnetization directions of the magnetic domain M2 and the magnetic domain M3 are different from each other, so that "1" is stored. When the magnetization directions are the same as between the magnetic domain M1 and the magnetic domain M2, there is no magnetic wall between the magnetic domain M1 and the magnetic domain M2.

Next, a write operation and a read operation in the magnetic memory will be described. In the read and write operations of data, magnetic domains of a target of the read operation or the write operation are shifted to a position of a mechanism for the read or write operation (hereinafter referred to as a read position or a write position). In other words, the magnetic wall between the magnetic domains are shifted so that the magnetic domains of the target of the read operation or the write operation are moved to the read position or the write position. The magnetic wall is shifted by, for example, flowing a current (shift current) through the magnetic material column MML.

FIGS. 5A to 5R are diagrams conceptually illustrating sequences of a write operation and a read operation on the magnetic material column MML.

First, the sequence of the write operation will be described. In the write operation, from a state before the write operation illustrated in FIG. 5A, when a write unit writes "0" as illustrated in FIG. 5B, "O" is written to a first boundary between magnetic domains of the magnetic material column MML. Next, as illustrated in FIG. 5C, when the write unit writes "1", "0" of the first boundary between magnetic domains of the magnetic material column MML is shifted to a second boundary between magnetic domains, and "1" is written to the first boundary between magnetic domains. Further, as illustrated in FIG. 5D, when the write unit writes "0", "0" of the second boundary between magnetic domains of the magnetic material column MML is shifted to a third boundary between magnetic domains, "1" of the first boundary between magnetic domains is shifted to the second boundary between magnetic domains, and "0" is written to the first boundary between magnetic domains.

In the write operations thereafter, in the same manner, as illustrated in FIGS. 5E to 5I, data written previously are shifted in a direction away from the write position, and data is written to the first boundary between magnetic domains.

Next, the sequence of the read operation will be described. FIGS. 5J to 5R are schematic diagrams of the read operation on the magnetic material column MML. In the read operation, as illustrated in FIG. 5J, a read current is flown through the magnetic material column MML, and a read unit reads "1" stored on the first boundary between magnetic domains of the magnetic material column MML.

Next, as illustrated in FIG. 5J, the shift current is flown through the magnetic material column MML, and the magnetic domains in the magnetic material column MML are shifted in a direction approaching the read position. Thereby, for example, "0" located on the second boundary between magnetic domains before the read operation is shifted to the first boundary between magnetic domains, and "1" located on the third boundary between magnetic domains is shifted to the second boundary between magnetic domains. Subsequently, as illustrated in FIG. 5K, the read current is flown through the magnetic material column MML, and "0" stored on the first boundary between magnetic domains of the magnetic material column MML is read by the read unit.

Next, as illustrated in FIG. 5K, the shift current is flown through the magnetic material column MML, and the magnetic domains in the magnetic material column MML are shifted in a direction approaching the read position. Thereby, for example, by the read operation illustrated in FIG. 5K, "1" located on the second boundary between magnetic domains is shifted to the first boundary between magnetic domains, and "0" located on the third boundary between magnetic domains is shifted to the second boundary between magnetic domains. Subsequently, as illustrated in FIG. 5L, the read current is flown through the magnetic material column MML, and "1" stored on the first boundary between magnetic domains of the magnetic material column MML is read by the read unit.

In the read operations thereafter, in the same manner, as illustrated in FIGS. 5M to 5R, the magnetic domains (or the magnetic walls) in the magnetic material column MML are shifted in a direction approaching the read position, and data stored on the first boundary between magnetic domains is read.

Next, an overview of a write operation in the magnetic memory 1 will be described with reference to FIGS. 6A to 6E. FIGS. 6A to 6E are diagrams illustrating the write operation in the magnetic memory 1 and schematically illustrate the magnetic material column MML.

A positional relationship between the field line FL and a write position WP is set so that a magnetic domain at the write position WP has a desired magnetization direction by an induction magnetic field generated when a current is flown through the field line FL.

In an initial state illustrated in FIG. 6A, as a preparation to write data, a predetermined magnetization direction is written to the magnetic material column MML as an initial magnetization direction (Pre Write). For example, as illustrated by wavy lines in FIG. 6A, the write control circuit 80 causes a current to flow through the field line FL in a direction from above the page to below the page and writes a magnetization direction of "←" into the magnetic domain M5 in the write position WP.

As illustrated in FIG. 6B, when the shift control circuit 50 causes the shift current to flow in the magnetic material column MML, the magnetic domain M5 in the magnetic material column MML is shifted below the write position WP and the magnetic domain M4 is set in the write position WP. The write control circuit 80 receives data "0" and lets no current flow through the field line FL according to the data "0". Thereby, the magnetization direction of "←" propagated from the magnetic domain M5 is written into the magnetic domain M4 in the write position WP. As a result, no magnetic wall is formed between the magnetic domain M4 and the magnetic domain M5, so that data "0" is written (0 Write).

As illustrated in FIG. 6C, when the shift control circuit 50 causes the shift current to flow in the magnetic material column MML, the magnetic domain M4 in the magnetic material column MML is shifted below the write position WP, the magnetic domain M5 is further shifted below, and the magnetic domain M3 is set in the write position WP. The write control circuit 80 receives data "1", causes a current to flow through the field line FL in a direction from below the page to above the page as illustrated by wavy lines in FIG. 6C according to the data "1", and writes a magnetization direction of "→" into the magnetic domain M3 in the write position WP. Thereby, a magnetization direction different from that of the magnetic domain M4 is written into the magnetic domain M3 in the write position WP. As a result, a magnetic wall is formed between the magnetic domain M3 and the magnetic domain M4, so that data "1" is written (1 Write).

As illustrated in FIG. 6D, when the shift control circuit 50 causes the shift current to flow in the magnetic material column MML, the magnetic domain M3 in the magnetic material column MML is shifted below the write position WP, the magnetic domains M4 and M5 are further shifted below, and the magnetic domain M2 is set in the write position WP. The write control circuit 80 receives data "0" and lets no current flow through the field line FL according to the data "0". Thereby, the magnetization direction of "→" propagated from the magnetic domain M3 is written into the magnetic domain M2 in the write position WP. As a result, no magnetic wall is formed between the magnetic domain M2 and the magnetic domain M3, so that data "0" is written (0 Write).

As illustrated in FIG. 6E, when the shift control circuit 50 causes the shift current to flow in the magnetic material column MML, the magnetic domain M2 in the magnetic material column MML is shifted below the write position WP, the magnetic domains M3 to M5 are further shifted below, and the magnetic domain M1 is set in the write position WP. The write control circuit 80 receives data "1", causes a current to flow through the field line FL in a direction from above the page to below the page as illustrated by wavy lines in FIG. 6E according to the data "1", and writes a magnetization direction of "←" into the magnetic domain M1 in the write position WP. Thereby, a magnetization direction different from that of the magnetic domain M2 is written into the magnetic domain M1 in the write position WP. As a result, a magnetic wall is formed between the magnetic domain M1 and the magnetic domain M2, so that data "1" is written (1 Write).

Figure 7:
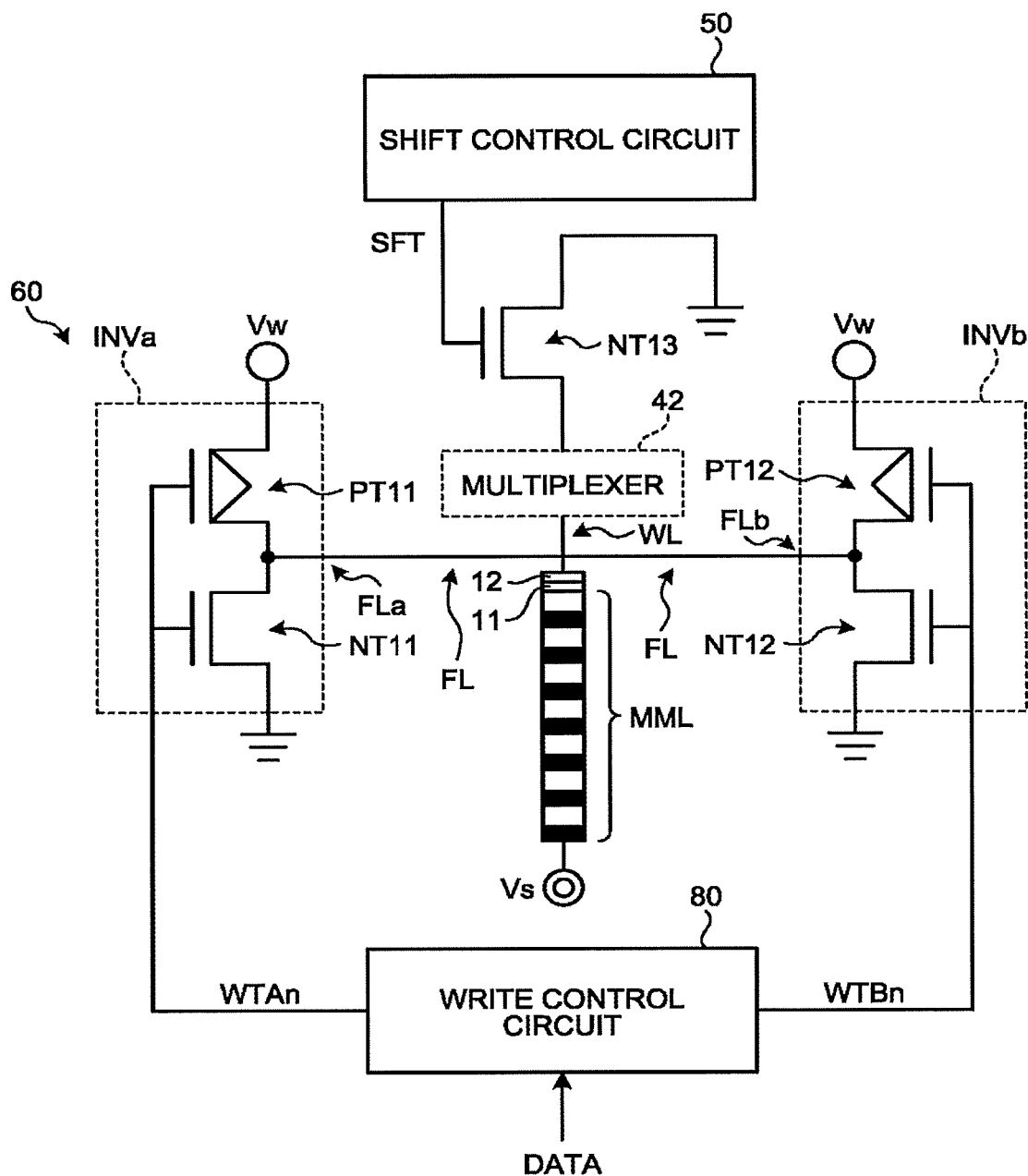
FIG. 7 is a diagram illustrating a circuit used for a write operation in the embodiment.

Next, a circuit related to the write operation will be described with reference to FIG. 7. FIG. 7 is a diagram illustrating a circuit used for the write operation.

The shift control circuit 50 is arranged on one end side of the magnetic material column MML. The shift control circuit 50 is arranged on the opposite side of the magnetic material column MML with an n-channel MOS transistor (hereinafter referred to as an nMOS transistor) NT13, a multiplexer 42, and the field line FL in between.

The gate of the nMOS transistor NT13 is electrically connected to the shift control circuit 50, the source of the nMOS transistor NT13 is electrically connected to a shift reference potential VS, and the drain of the nMOS transistor NT13 is electrically connected to the multiplexer 42. The shift reference potential VS is a potential higher than a ground potential. The shift control circuit 50 generates and outputs a shift signal SFT. When the gate of the nMOS transistor NT13 receives the shift signal SFT of an active level, the nMOS transistor NT13 turns on, so that the nMOS transistor NT13 can cause the shift current to flow through the magnetic material column MML. The multiplexer 42 can select one of a shift circuit for writing (the nMOS transistor NT13) and a shift circuit for reading (see FIG. 11) and electrically connect the selected shift circuit to the magnetic material column MML. In the write operation, the multiplexer 42 can select the shift circuit for writing (the nMOS transistor NT13) and electrically connect the shift circuit for writing to the magnetic material column MML.

The field line FL passes near one end of the magnetic material column MML. The field line FL passes near one end of the magnetic material column MML at a position eccentric from the central axis of the magnetic material column MML. Thereby, when a current (write current) in a desired direction is flown through the field line FL, it is possible to magnetize a portion near the one end of the magnetic material column MML in a desired magnetization direction. For example, when a current in a desired direction is flown through the field line FL, a part in a circumferential direction of a portion near the one end of the magnetic material column MML is magnetized. However, the magnetization direction is propagated in the circumferential direction, so that the magnetization direction may be radially distributed in a cross-sectional view (see FIG. 4).

The FL driver 60 has a plurality of inverters INVa and INVb. The plurality of inverters INVa and INVb are arranged at both ends of the field line FL.

The inverter INVa has an nMOS transistor NT11 and a p-channel MOS transistor (hereinafter referred to as a pMOS transistor) PT11. The nMOS transistor NT11 and the pMOS transistor PT11 are inverter-connected between the ground potential and a write reference potential VW. The write reference potential VW is a potential higher than the ground potential and is a potential different from the shift reference potential VS. The drain of the nMOS transistor NT11 and the drain of the pMOS transistor PT11 are commonly connected to one end FLa of the field line FL. The gate of the nMOS transistor NT11 and the gate of the pMOS transistor PT11 are commonly connected to the write control circuit 80. When the inverter INVa receives an active-level control signal WTAn, the inverter INVa can pull up a potential of the one end FLa of the field line FL to the write reference potential VW by turning off the nMOS transistor NT11 and turning on the pMOS transistor PT11. The control signal WTAn may be a low-active control signal (n represents low-active). At this time, the control signal WTBn is a non-active level (H level), and the inverter INVb pulls down a potential of the other end FLb of the field line FL to the ground potential. Thereby, a current (write current) can be flown through the field line FL in a direction from the one end FLa to the other end FLb.

The inverter INVb has an nMOS transistor NT12 and a pMOS transistor PT12. The nMOS transistor NT12 and the pMOS transistor PT12 are inverter-connected between the ground potential and the write reference potential VW. The drain of the nMOS transistor NT12 and the drain of the pMOS transistor PT12 are commonly connected to the other end FLb of the field line FL. The gate of the nMOS transistor NT12 and the gate of the pMOS transistor PT12 are commonly connected to the write control circuit 80. When the inverter INVb receives an active-level control signal WTBn, the inverter INVb can pull up a potential of the other end FLb of the field line FL to the write reference potential VW by turning off the nMOS transistor NT12 and turning on the pMOS transistor PT12. The control signal WTBn may be a low-active control signal (n represents low-active). At this time, the control signal WTAn is a non-active level (H level), and the inverter INVa pulls down a potential of the one end FLa of the field line FL to the ground potential. Thereby, a current (write current) can be flown through the field line FL in a direction from the other end FLb to the one end FLa.

Figure 8:
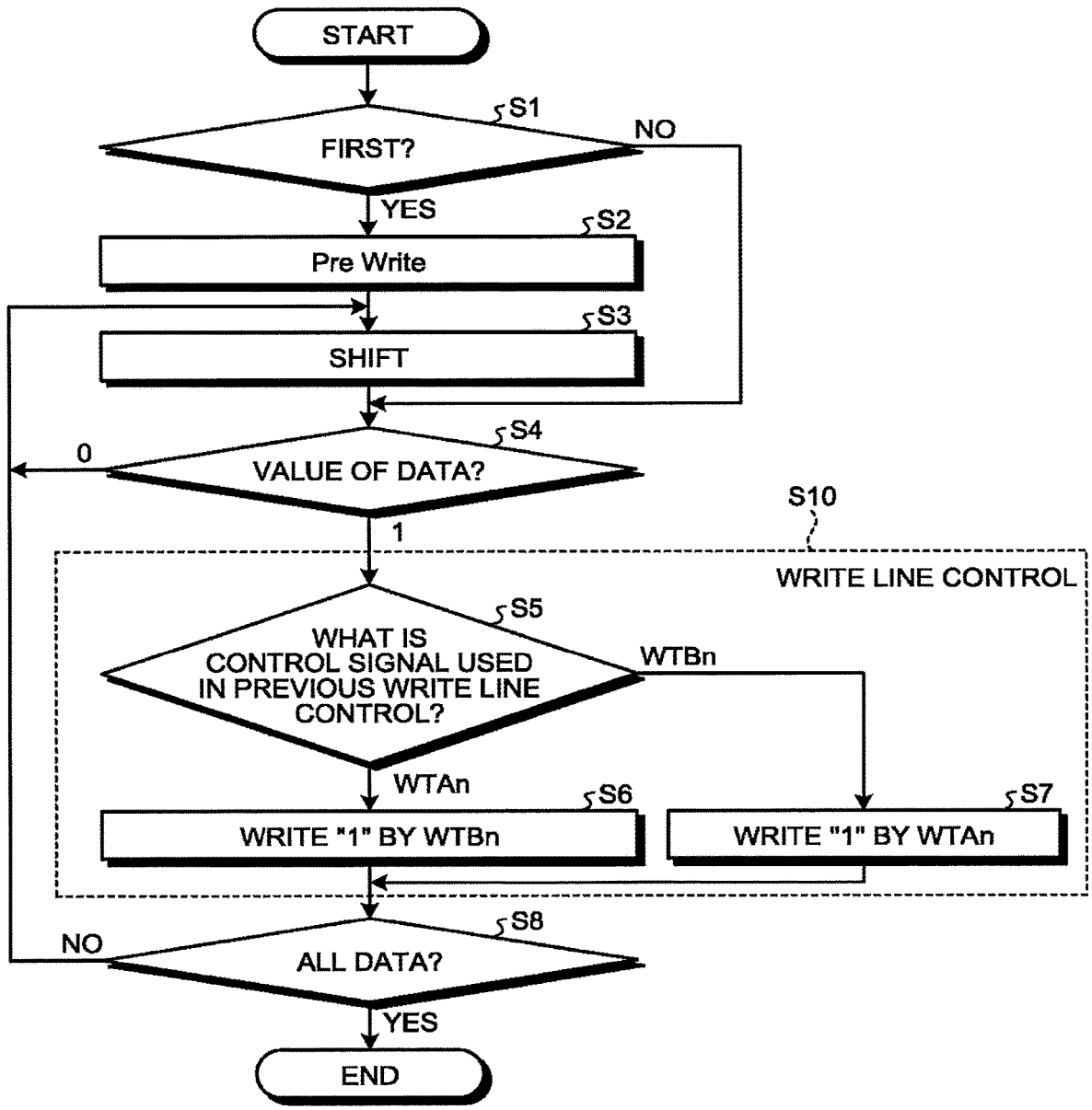
FIG. 8 is a flowchart illustrating a write method in the embodiment.

Next, a write method will be described with reference to FIG. 8. FIG. 8 is a flowchart illustrating the write method.

When the magnetic memory 1 selects a magnetic material column MML, to which data should be written, from among a plurality of magnetic material columns MML in the memory cell array 10, the magnetic memory 1 determines whether or not it is the first time that data is written to the selected magnetic material column MML (S1). For example, the magnetic memory 1 has management information for managing a data write state for each of the plurality of magnetic material columns MML in the memory cell array 10, and the magnetic memory 1 can determine whether or not it is the first time that data is written to the selected magnetic material column MML by referring to the management information.

When it is the first time that data is written to the selected magnetic material column MML (Yes in S1), the magnetic memory 1 sets the control signal WTAn or the control signal WTBn to an active level and writes a predetermined magnetization direction into the magnetic material column MML as an initial magnetization direction as preparation for writing data (Pre Write) (S2). The magnetic memory 1 causes the shift current to flow in the magnetic material column MML (S3). Thereby, a magnetic domain at the write position in the magnetic material column MML is shifted below the write position and a new magnetic domain is set at the write position. Then, the magnetic memory 1 determines a value of data to be written to the magnetic material column MML (S4).

On the other hand, when it is not the first time that data is written to the selected magnetic material column MML (No in S1), the magnetic memory 1 does not perform S2 and S3 and determines a value of data to be written to the magnetic material column MML (S4).

Figure 10:
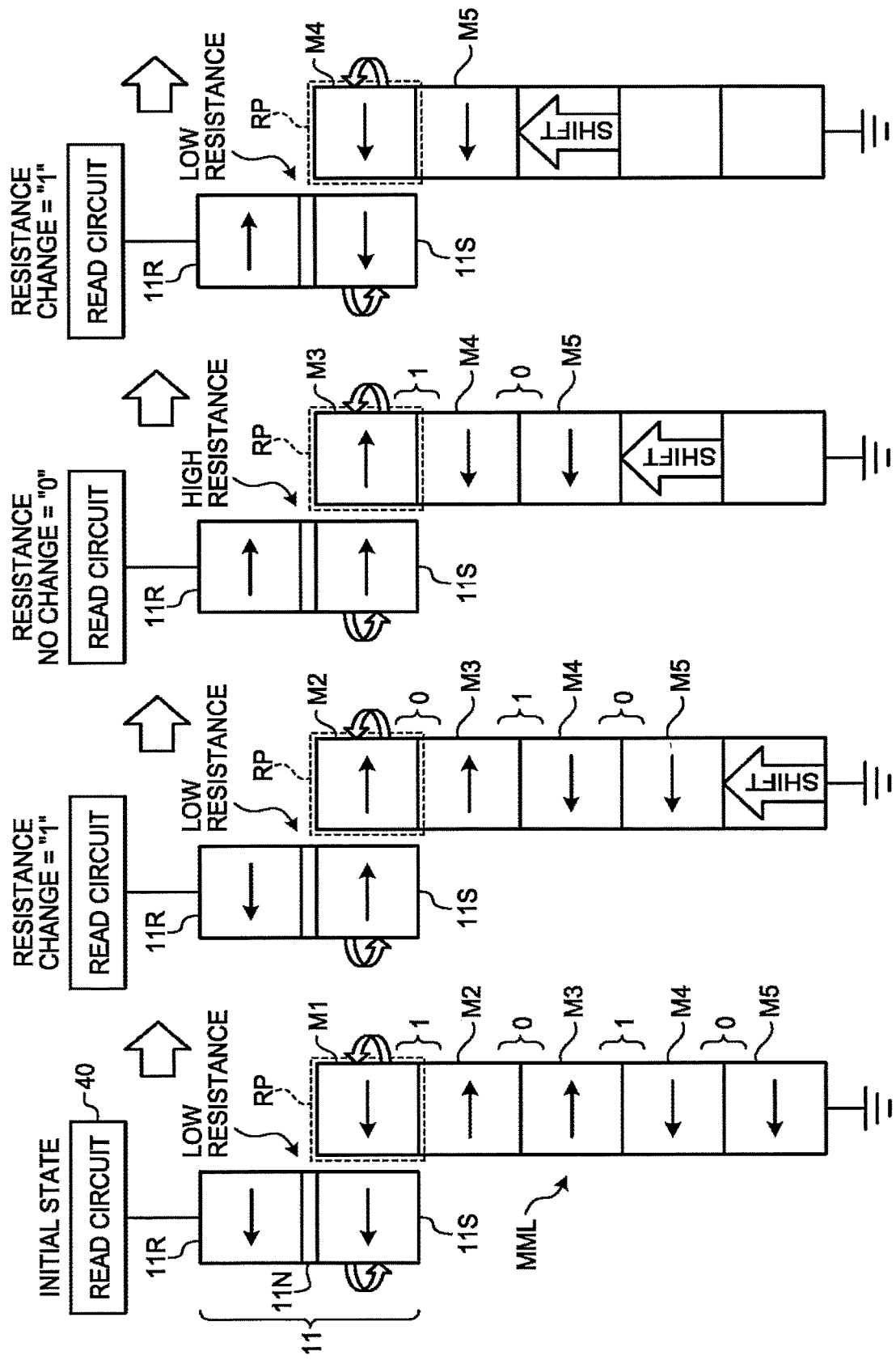
FIGS. 10A to 10D are diagrams illustrating a read operation in the embodiment.

When the value of data is "0", the magnetic memory 1 does not perform a write line control operation (S10) and returns processing to S3. When the value of data is "1", the magnetic memory 1 performs the write line control operation (S10). Specifically, the magnetic memory 1 performs processing of S5 to S7 in FIG. 10.

The magnetic memory 1 determines the control signal used in the previous write line control (S5).

When the previous control signal is WTAn (WTAn in S5), the magnetic memory 1 sets the control signal WTBn to the active level and writes "1" into the magnetic material column MML so that the magnetization direction to be written into the magnetic material column MML is opposite to that of the previous time (S6).

On the other hand, when the previous control signal is WTBn (WTBn in S5), the magnetic memory 1 sets the control signal WTAn to the active level and writes "1" into the magnetic material column MML so that the magnetization direction to be written into the magnetic material column MML is opposite to that of the previous time (S7).

The magnetic memory 1 determines whether or not all the data to be written have been written into the magnetic material column MML (S8). For example, the magnetic memory 1 refers to the management information, and when the number of data that have been written into the magnetic material column MML reaches an upper limit of the number of data that can be written, the magnetic memory 1 determines that all the data to be written have been written into the magnetic material column MML. When not all the data to be written have been written into the magnetic material column MML (No in S8), the magnetic memory 1 returns the processing to S3, and when all the data to be written have been written into the magnetic material column MML (Yes in S8), the magnetic memory 1 completes the processing.

Figure 9:
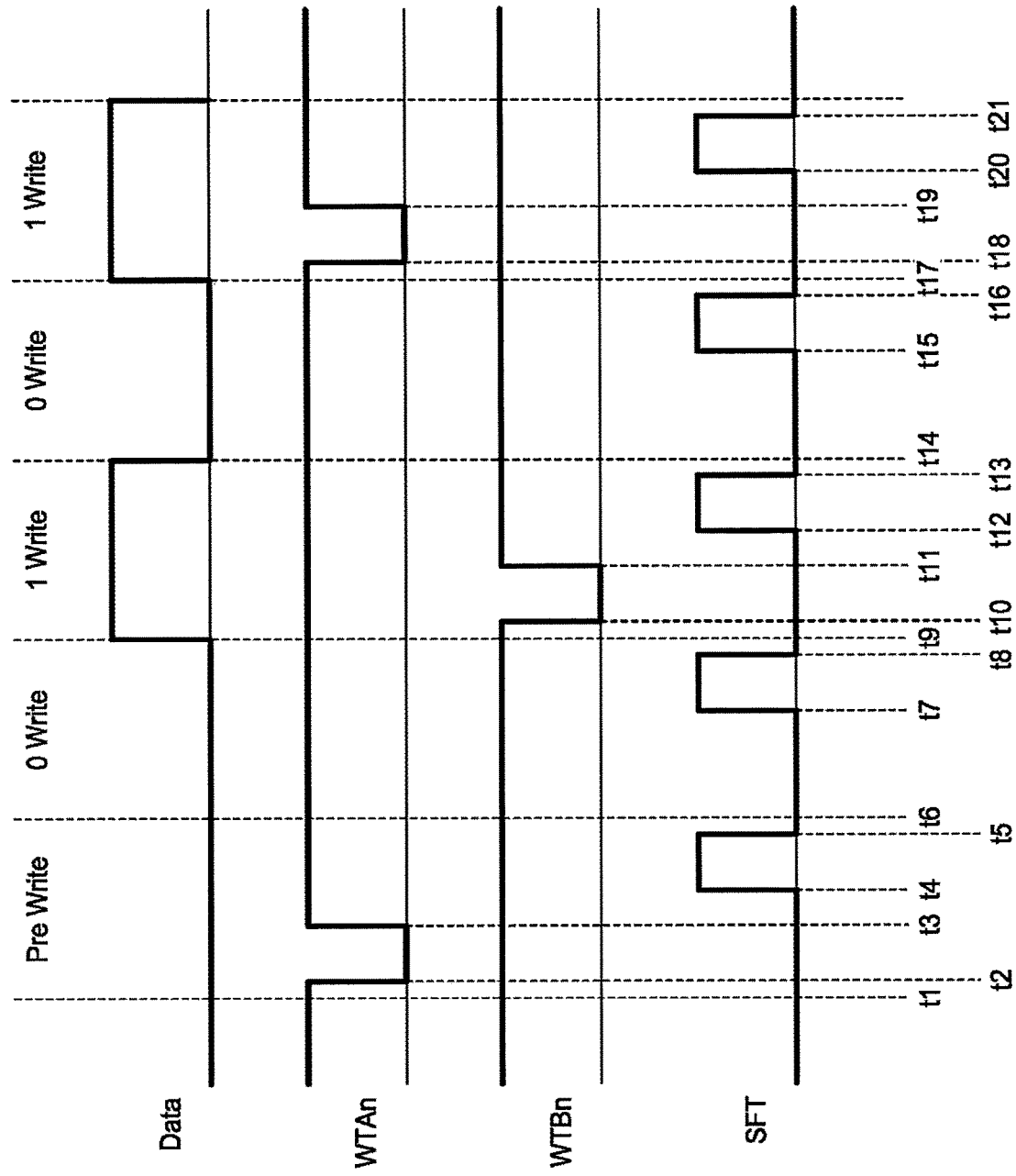
FIG. 9 is a waveform chart illustrating a write operation in the embodiment.

Next, details of the write operation will be described with reference to FIG. 9. FIG. 9 is a waveform chart illustrating the write operation.

At timing t1, the write control circuit 80 maintains both the control signal WTAn and the control signal WTBn at the non-active level (for example, H level). The shift control circuit 50 maintains the shift control signal SFT at a non-active level (for example, L level).

At timing t2, when the write control circuit 80 receives an instruction to perform preparation for writing data (Pre Write) from the controller 70, the write control circuit 80 changes the control signal WTAn from the non-active level to the active level (for example, L level) according to the instruction. At this time, the write control circuit 80 maintains the control signal WTBn at the non-active level (for example, H level). Thereby, a current (write current) can be flown through the field line FL in a direction from the one end FLa to the other end FLb, and, for example, a magnetization direction of "←" can be written into the magnetic domain M5 in the write position WP (see FIG. 6A).

At timing t3, the write control circuit 80 changes the control signal WTAn from the active level to the non-active level.

At timing t4, the shift control circuit 50 changes the shift control signal SFT from the non-active level to the active level (for example, H level). Thereby, the shift current is flown through the magnetic material column MML, for example, the magnetic domain M5 in the magnetic material column MML is shifted below the write position WP, and the magnetic domain M4 is set in the write position WP (see FIG. 6B).

At timing t5, the shift control circuit 50 changes the shift control signal SFT from the active level to the non-active level.

At timing t6, when the write control circuit 80 receives data "0", the write control circuit 80 maintains both the control signal WTAn and the control signal WTBn at the non-active level (for example, H level). Thereby, no write current is flown through the field line FL, so that no magnetic wall is formed between the magnetic domain M4 and the magnetic domain M5, and data "0" is written (see FIG. 6B).

At timing t7, the shift control circuit 50 changes the shift control signal SFT from the non-active level to the active level. Thereby, the shift current is flown through the magnetic material column MML, for example, the magnetic domain M4 in the magnetic material column MML is shifted below the write position WP, the magnetic domain M5 is further shifted below, and the magnetic domain M3 is set in the write position WP (see FIG. 6C).

At timing t8, the shift control circuit 50 changes the shift control signal SFT from the active level to the non-active level.

At timing t9, when the write control circuit 80 receives data "1", the write control circuit 80 determines that the control signal WTBn should be the active level according to a fact that the control signal that is changed to the active level in the previous time (timing t2 to t3) is WTAn.

At timing t10, the write control circuit 80 changes the control signal WTBn from the non-active level to the active level. At this time, the write control circuit 80 maintains the control signal WTAn at the non-active level. Thereby, a current (write current) can be flown through the field line FL in a direction from the other end FLb to the one end FLa, and, for example, a magnetic wall is formed between the magnetic domain M3 and the magnetic domain M4, so that data "1" is written (see FIG. 6C).

At timing t11, the write control circuit 80 changes the control signal WTBn from the active level to the non-active level.

At timing t12, the shift control circuit 50 changes the shift control signal SFT from the non-active level to the active level. Thereby, the magnetic domain M3 in the magnetic material column MML is shifted below the write position WP, the magnetic domains M4 and M5 are further shifted below, and the magnetic domain M2 is set in the write position WP (see FIG. 6D).

At timing t13, the shift control circuit 50 changes the shift control signal SFT from the active level to the non-active level.

At timing t14, when the write control circuit 80 receives data "0", the write control circuit 80 maintains both the control signal WTAn and the control signal WTBn at the non-active level. Thereby, no write current is flown through the field line FL, so that no magnetic wall is formed between the magnetic domain M2 and the magnetic domain M3, and data "0" is written (see FIG. 6D).

At timing t15, the shift control circuit 50 changes the shift control signal SFT from the non-active level to the active level. Thereby, the shift current is flown through the magnetic material column MML, for example, the magnetic domain M2 in the magnetic material column MML is shifted below the write position WP, the magnetic domains M3 to M5 are further shifted below, and the magnetic domain M1 is set in the write position WP (see FIG. 6E).

At timing t16, the shift control circuit 50 changes the shift control signal SFT from the active level to the non-active level.

At timing t17, when the write control circuit 80 receives data "1", the write control circuit 80 determines that the control signal WTAn should be the active level according to a fact that the control signal that is changed to the active level in the previous time (timing t10 to t11) is WTBn.

At timing t18, the write control circuit 80 changes the control signal WTAn from the non-active level to the active level. At this time, the write control circuit 80 maintains the control signal WTBn at the non-active level. Thereby, a current (write current) can be flown through the field line FL in a direction from the one end FLa to the other end FLb, and, for example, a magnetic wall is formed between the magnetic domain M1 and the magnetic domain M2, so that data "1" is written (see FIG. 6E).

At timing t19, the write control circuit 80 changes the control signal WTAn from the active level to the non-active level.

At timing t20, the shift control circuit 50 changes the shift control signal SFT from the non-active level to the active level. Thereby, the magnetic domain M1 in the magnetic material column MML is shifted below the write position WP, the magnetic domains M2 to M5 are further shifted below, and a magnetic domain M0 (not illustrated in the drawings) is set in the write position WP.

At timing t21, the shift control circuit 50 changes the shift control signal SFT from the active level to the non-active level.

Next, an overview of a read method in the magnetic memory will be described with reference to FIGS. 10A to 10D. FIGS. 10A to 10D are diagrams illustrating the read method in the magnetic memory and schematically illustrate the magnetoresistive effect element (for example, an MTJ element) 11 and the magnetic material column MML.

A positional relationship between the magnetic layer 11S of the magnetoresistive effect element 11 and a read position RP is set so that the magnetic layer 11S has the same magnetization direction as that of the magnetic domain of the read position RP by a magnetic induction (or induction magnetic field) from the magnetic domain existing in the read position RP to the magnetic layer 11S of the magnetoresistive effect element 11.

In an initial state illustrated in FIG. 10A, the magnetic domain M1 is arranged in the read position RP, and the magnetic domains M2, M3, M4, and M5 are arranged in order in a direction away from the read position RP. At this time, the magnetic layer 11S holds the same magnetization direction as that of the magnetic domain M1 by the magnetic induction from the magnetic domain M1 arranged in the read position RP. Thereby, the magnetic layer 11S of the magnetoresistive effect element 11 has the magnetization direction parallel with (in the same direction as) the magnetization direction of the magnetic layer 11R. Thereby, an electric resistance of the magnetoresistive effect element 11 becomes low, and the read circuit 40 senses that the magnetoresistive effect element 11 is in a low resistance state.

Next, as illustrated in FIG. 10B, magnetic domains in the magnetic material column MML are shifted in a direction toward the read position RP and the magnetic domain M2 is set in the read position RP. The magnetic layer 11S holds the same magnetization direction as that of the magnetic domain M2 by the magnetic induction from the magnetic domain M2 arranged in the read position RP. Thereby, the magnetic layer 11S has the magnetization direction anti-parallel with that of the magnetic layer 11R. Thereby, in the same manner as in the FIG. 10A, the electric resistance of the magnetoresistive effect element 11 becomes high, and the read circuit 40 senses that the magnetoresistive effect element 11 is in a high resistance state.

In this way, when the first sense illustrated in FIG. 10A and the second sense illustrated in FIG. 10B are different resistance states, the read circuit 40 outputs, for example, "1".

In other words, "1" is outputted as data stored in the magnetic domains M1 and M2. Here, a case has been described where the first sense is the low resistance state and the second sense is the high resistance state. However, in a case where first sense is the high resistance state and the second sense is the low resistance state, the read circuit 40 also outputs "0".

Next, as illustrated in FIG. 10C, magnetic domains in the magnetic material column MML are shifted in the direction toward the read position RP and the magnetic domain M3 is set in the read position RP. The magnetic layer 11S holds the same magnetization direction as that of the magnetic domain M3 by the magnetic induction from the magnetic domain M3 arranged in the read position RP. Thereby, the magnetic layer 11S has the magnetization direction anti-parallel with (in the opposite direction to) that of the magnetic layer 11R. Thereby, the electric resistance of the magnetoresistive effect element 11 becomes high, and the read circuit 40 senses that the magnetoresistive effect element 11 is in a high resistance state.

In this way, when both the second sense illustrated in FIG. 10B and the third sense illustrated in FIG. 10C are the high resistance state, the read circuit 40 outputs, for example, "0". In other words, "0" is outputted as data stored in the magnetic domains M2 and M3. Here, a case has been described where both the first sense and the second sense are the high resistance state. However, in a case where both the first sense and the second sense are the low resistance state, the read circuit 40 also outputs "0".

Next, as illustrated FIG. 10D, magnetic domains in the magnetic material column MML are shifted in the direction toward the read position RP and the magnetic domain M4 is set in the read position RP. The magnetic layer 11S holds the same magnetization direction as that of the magnetic domain M4 by the magnetic induction from the magnetic domain M4 arranged in the read position RP. Thereby, the magnetic layer 11S has the magnetization direction parallel with that of the magnetic layer 11R.

Thereby, the electric resistance of the magnetoresistive effect element 11 becomes low, and the read circuit 40 senses that the magnetoresistive effect element 11 is in a low resistance state.

In this way, when the third sense illustrated in FIG. 10C and the fourth sense illustrated in FIG. 10D are different resistance states, the read circuit 40 outputs, for example, "1".

In other words, "1" is outputted as data stored in the magnetic domains M3 and M4.

In this read method, when the resistance state of the previous sense is the same as the resistance state of the current sense, it is determined as the second data (for example, "0"). On the other hand, when the resistance state of the previous sense is different from the resistance state of the current sense, it is determined as the first data (for example, "1"). That is, when two continuous low resistance states or two continuous high resistance states are sensed by two continuous senses, it is determined as the second data, and when different resistance states are sensed by two continuous senses, it is determined as the first data. In other words, the resistances of the magnetoresistive effect element 11 for two adjacent magnetic domains in the magnetic material column MML are sensed, and when the resistances of the magnetoresistive effect element 11 are the same, it is determined as the second data, and when the resistances of the magnetoresistive effect element 11 are different from each other, it is determined as the first data.

Figure 11:
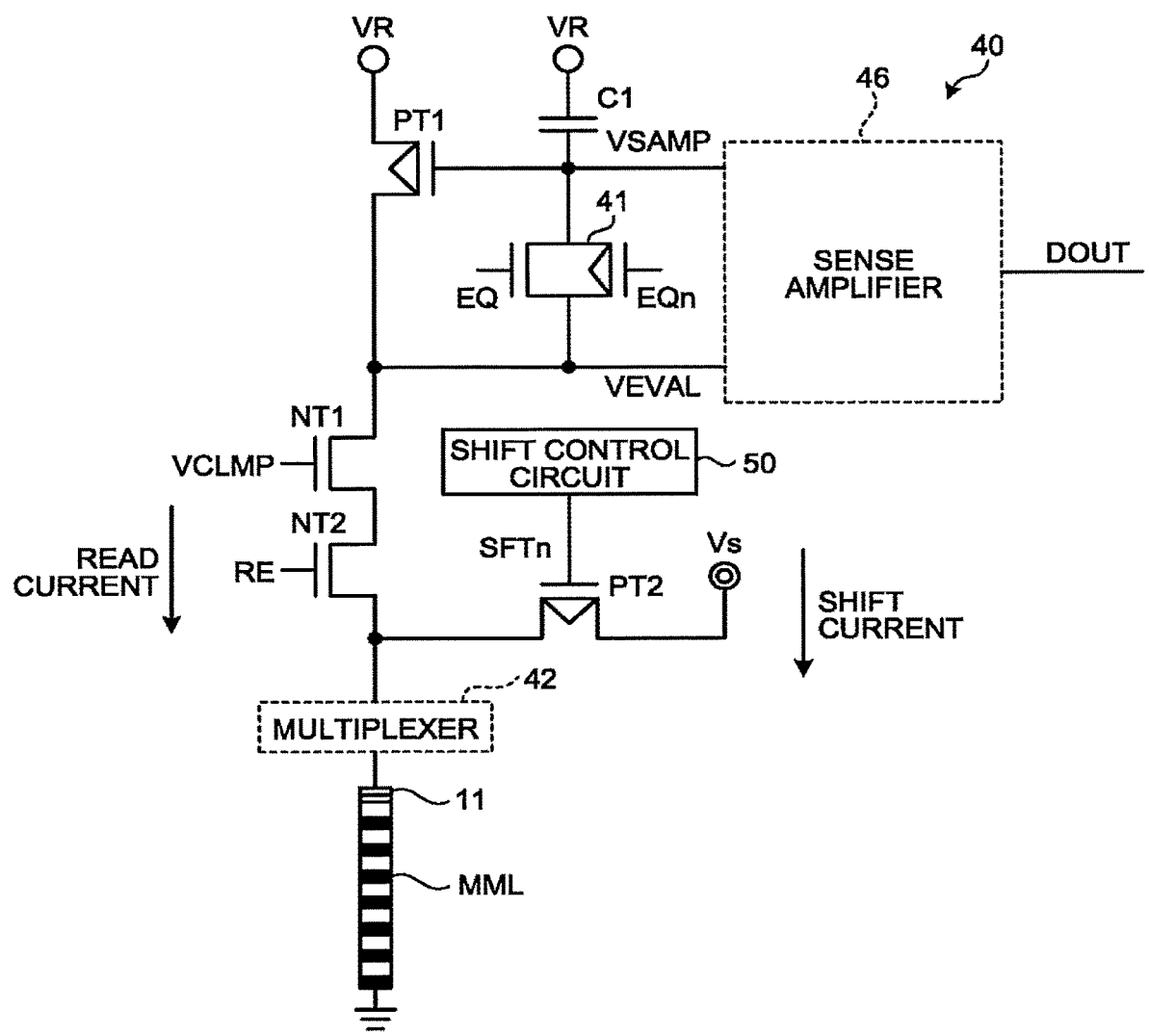
FIG. 11 is a diagram illustrating a circuit used for a read operation in the embodiment.

FIG. 11 is a circuit diagram illustrating a configuration of a circuit related to the read operation. The read circuit 40 includes a capacitor C1, a sense amplifier 46, an equalizer circuit 41, a multiplexer (Mux) 42, p-channel MOS transistors (hereinafter referred to as pMOS transistors) PT1 and PT2, and n-channel MOS transistors (hereinafter referred to as nMOS transistors) NT1 and NT2.

Hereinafter, a circuit connection of the read circuit illustrated in FIG. 11 will be described. A first input terminal of the sense amplifier 46 is connected to a first electrode of the capacitor C1, the gate of the pMOS transistor PT1, and a first terminal of the equalizer circuit 41. A second input terminal of the sense amplifier 46 is connected to the drain of the pMOS transistor PT1, the drain of the nMOS transistor NT1, and a second terminal of the equalizer circuit 41. The source of the nMOS transistor NT1 is connected to the drain of the pMOS transistor PT2 and an input terminal of the multiplexer 42 through the nMOS transistor NT2. A read reference potential VR is supplied to a second electrode of the capacitor C1 and the source of the pMOS transistor PT1. The read reference potential VR is a potential higher than the ground potential. Further, the shift reference potential VS is supplied to the source of the pMOS transistor PT2. The shift reference potential VS is a potential higher than the ground potential and is a potential different from the read reference potential VR.

A shift signal SFTn is inputted into the gate of the pMOS transistor PT2. A clamp signal VCLMP is inputted into the gate of the nMOS transistor NT1, and a read enable signal RE is inputted into the gate of the nMOS transistor NT2. Equalize signals EQ and EQn are inputted into gates of transistors of the equalizer circuit 41. An output signal DOUT is outputted from the sense amplifier 46. Here, "n" added to the code of the signal indicates that the signal is a low-active signal.

An output terminal of the multiplexer 42 is connected to the ground potential through the magnetoresistive effect element 11 and the magnetic material column MML.

In the read circuit 40, a pre-stage circuit of the sense amplifier 46 functions as a pre-amplifier that senses a resistance state of the magnetoresistive effect element 11. The pre-amplifier accumulates a state signal according to the resistance state of the magnetoresistive effect element 11 in the capacitor C1.

Figure 12:
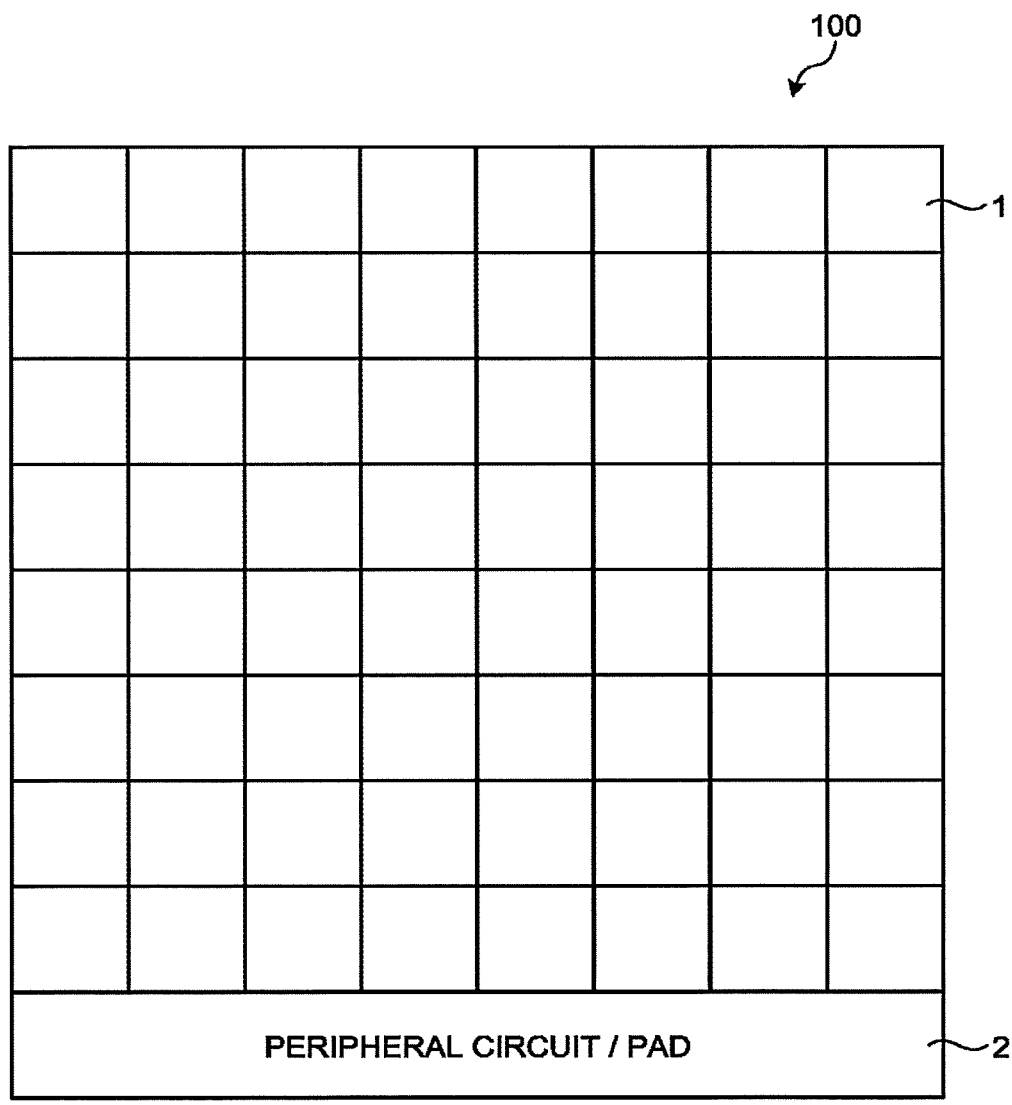
FIG. 12 is a diagram illustrating a memory chip where magnetic memories according to the embodiment are arranged.
Figure 13:
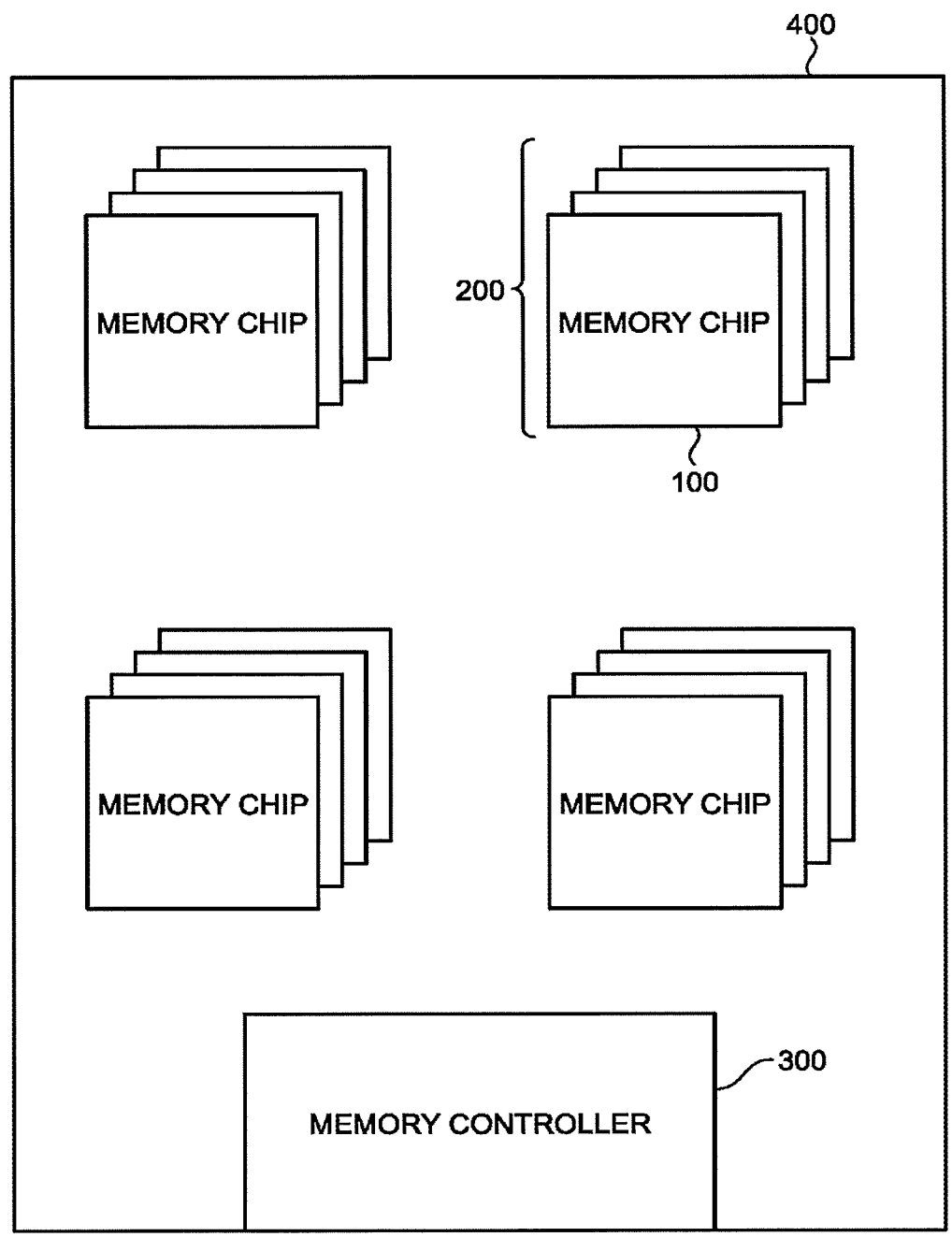
FIG. 13 is a diagram illustrating a memory system mounted with a memory chip where the magnetic memory according to the embodiment is arranged.

FIG. 12 is a diagram illustrating a memory chip (semiconductor device) where a plurality of magnetic memories 1 are arranged. FIG. 13 is a diagram illustrating a memory system mounted with memory chips. The memory system is, for example, SSD (Solid State Drive).

As illustrated in FIG. 12, a plurality of magnetic memories 1 are arranged in an array form on a memory chip 100. A peripheral circuit and a pad 2 are provided on the memory chip 100. The peripheral circuit includes a circuit that controls write and read operations to and from the magnetic memories 1 and a power supply circuit for generating various power sources supplied to the magnetic memories 1. The pad includes electrodes and the like used to connect with the outside.

As illustrated in FIG. 13, for example, a plurality of memory chips 100 are stacked to become a multi-chip 200. Further, the multi-chips 200 are mounted on a memory system 400 along with a memory controller 300 that controls the multi-chips 200.

As described above, in the present embodiment, in the magnetic memory 1, when writing the data of the first value, a current is flown through the write line so as to form a magnetic wall, and when writing the data of the second value, no current is flown through the write line so as not to form a magnetic wall. Thereby, the write operation of the magnetic memory 1 can be performed with low power consumption. In other words, it is possible to reduce the power consumption of the magnetic memory 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a magnetic material column;
a shift control circuit connected to the magnetic material column; and
a write control circuit configured to cause a current to flow through a write line passing near one end of the magnetic material column if writing data having a first value into the magnetic material column, and cause no current to flow through the write line if writing data having a second value into the magnetic material column.

2. The magnetic memory according to claim 1, wherein if the write control circuit receives a write operation command, the write control circuit causes a current to flow through the write line before writing data at a first bit position.

3. The magnetic memory according to claim 2, wherein the write control circuit causes a current to flow through the write line in a first direction before writing the data at the first bit position and causes a current to flow through the write line in a second direction opposite to the first direction if writing into the magnetic material column the data at the first or after bit position for the first time having the first value.

4. The magnetic memory according to claim 1, wherein the write control circuit writes the data of the first value into the magnetic material column by causing a current to flow through the write line in a first direction in a first period, and writes the data of the first value into the magnetic material column by causing a current to flow through the write line in a second direction opposite to the first direction in a second period after the first period.

5. The magnetic memory according to claim 4, wherein the write control circuit writes the data of the first value into the magnetic material column by causing a current to flow through the write line in the first direction in a third period after the second period.

6. The magnetic memory according to claim 4, wherein the write control circuit writes an initial value into the magnetic material column by causing a current to flow through the write line in the second direction in a fourth period before the first period.

7. The magnetic memory according to claim 1, wherein the shift control circuit causes a current to flow through the magnetic material column if writing the data of the first value into the magnetic material column, and causes a current to flow through the magnetic material column if writing the data of the second value into the magnetic material column.

8. The magnetic memory according to claim 4, wherein the shift control circuit causes a current to flow through the magnetic material column in a third direction in a fifth period between the first period and the second period.

9. The magnetic memory according to claim 5, wherein the shift control circuit causes a current to flow through the magnetic material column in a third direction in a sixth period between the second period and the third period.

10. The magnetic memory according to claim 6, wherein the shift control circuit causes a current to flow through the magnetic material column in a third direction in a seventh period between the fourth period and the first period.

11. A magnetic memory comprising:
a magnetic material column;
a shift control circuit connected to the magnetic material column;
a write line which passes near the magnetic material column and has a first end and a second end; and
a write control circuit configured so that a first potential difference between the first end and the second end if data having a first value is written to the magnetic material column is greater than a second potential difference between the first end and the second end if data having a second value is written to the magnetic material column.

12. The magnetic memory according to claim 11, wherein if the write control circuit receives a write operation command, the write control circuit generates the first potential difference between the first end and the second end before writing data of a least significant bit.

13. The magnetic memory according to claim 12, wherein the write control circuit sets a voltage of the first end higher than a voltage of the second end before writing the data at a first bit position and sets the voltage of the second end higher than the voltage of the first end if writing into the magnetic material column the data at the first or after bit position for the first time having the first value.

14. The magnetic memory according to claim 11, wherein the write control circuit sets a voltage of the first end higher than a voltage of the second end in a first period in which the write control circuit writes the data of the first value and sets the voltage of the second end higher than the voltage of the first end in a second period in which the write control circuit writes the data of the first value after the first period.

15. The magnetic memory according to claim 14, wherein the write control circuit sets the voltage of the first end higher than the voltage of the second end in a third period in which the write control circuit writes the data of the first value after the second period.

16. The magnetic memory according to claim 14, wherein the write control circuit sets the voltage of the second end higher than the voltage of the first end in a fourth period before the first period.

17. The magnetic memory according to claim 11, wherein the magnetic material column has a third end and a fourth end, and the shift control circuit sets a voltage of the third end higher than a voltage of the fourth end if writing the data of the first value into the magnetic material column, and sets the voltage of the third end higher than the voltage of the fourth end if writing the data of the second value into the magnetic material column.

18. The magnetic memory according to claim 14, wherein the magnetic material column has a third end and a fourth end, and the shift control circuit sets the voltage of the third end higher than the voltage of the fourth end in a fifth period between the first period and the second period.

19. The magnetic memory according to claim 15, wherein the magnetic material column has a third end and a fourth end, and the shift control circuit sets the voltage of the third end higher than the voltage of the fourth end in a sixth period between the second period and the third period.

20. The magnetic memory according to claim 16, wherein the magnetic material column has a third end and a fourth end, and the shift control circuit sets the voltage of the third end higher than the voltage of the fourth end in a seventh period between the fourth period and the first period.

* * * * *